United States Patent [19]

Sakabe

[11] Patent Number: 5,691,948

[45] Date of Patent: Nov. 25, 1997

[54] MEMORY APPARATUS

[75] Inventor: Tetsuya Sakabe, Higashine, Japan

[73] Assignee: Fujitsu Limited, Kawasaki, Japan

[21] Appl. No.: 761,009

[22] Filed: Dec. 5, 1996

Related U.S. Application Data

[63] Continuation of Ser. No. 620,005, Mar. 21, 1996, abandoned.

[30] Foreign Application Priority Data

Jun. 8, 1995 [JP] Japan ................................. 7-141687

[51] Int. Cl.$^6$ ................................................. G11C 5/14
[52] U.S. Cl. ........................... 365/227; 365/226; 395/750
[58] Field of Search ............................. 365/226, 227, 365/229; 395/750

[56] References Cited

U.S. PATENT DOCUMENTS 5,430,881  7/1995  Ikeda ............................. 365/229

FOREIGN PATENT DOCUMENTS

| 63-014369 | 1/1988 | Japan . |
| 63-255868 | 10/1988 | Japan . |
| 02306483 | 12/1990 | Japan . |
| 04123359 | 4/1992 | Japan . |
| 04221458 | 8/1992 | Japan . |

*Primary Examiner*—Tan T. Nguyen
*Attorney, Agent, or Firm*—Greer, Burns & Crain, Ltd.

[57] ABSTRACT

A measuring unit measures a time (T) of a command interval by setting the end of a command generated from an upper apparatus to a start timing or by setting the start of the reception of the next command to a stop timing. A timing deciding unit varies a plurality of timings to perform a power saving on the basis of the measurement time of the command interval which was measured by the measuring unit. A power save control unit controls the apparatus to a power saving mode for a time interval from the timing decided by the timing deciding after the end of the execution of the command received from said upper apparatus until a timing when a next command is obtained.

18 Claims, 14 Drawing Sheets

FIG. 3A

| MEASUREMENT TIME T (SECOND) | CONTENTS OF POWER SAVING | | | |
|---|---|---|---|---|
| T<5 | NO POWER SAVING | | | |
| 5≦T<30 | POWER SAVE TIMING | | | |
| | $t_1 = 0.8T$ | $t_2 = 1.0T$ | $t_3 = 1.2T$ | $t_4 = 1.4T$ |
| 30≦T | POWER SAVE TIMING | | | |
| | $t_1 = 1$ | $t_2 = 10$ | $t_3 = 30$ | $t_4 = 60$ |

FIG. 3B

| POWER SAVE TIMING | MODE NO. | POWER SAVING CIRCUIT UNIT | | | |
|---|---|---|---|---|---|
| | | R/W CIRCUIT UNIT | CLOCK OSCILLATING CIRCUIT | VCM DRIVER | SPM/COOLING FAN |
| t1 | 1 | ○ | | | |
| t2 | 2 | | ○ | | |
| t3 | 3 | | | ○ | |
| t4 | 4 | | | | ○ |

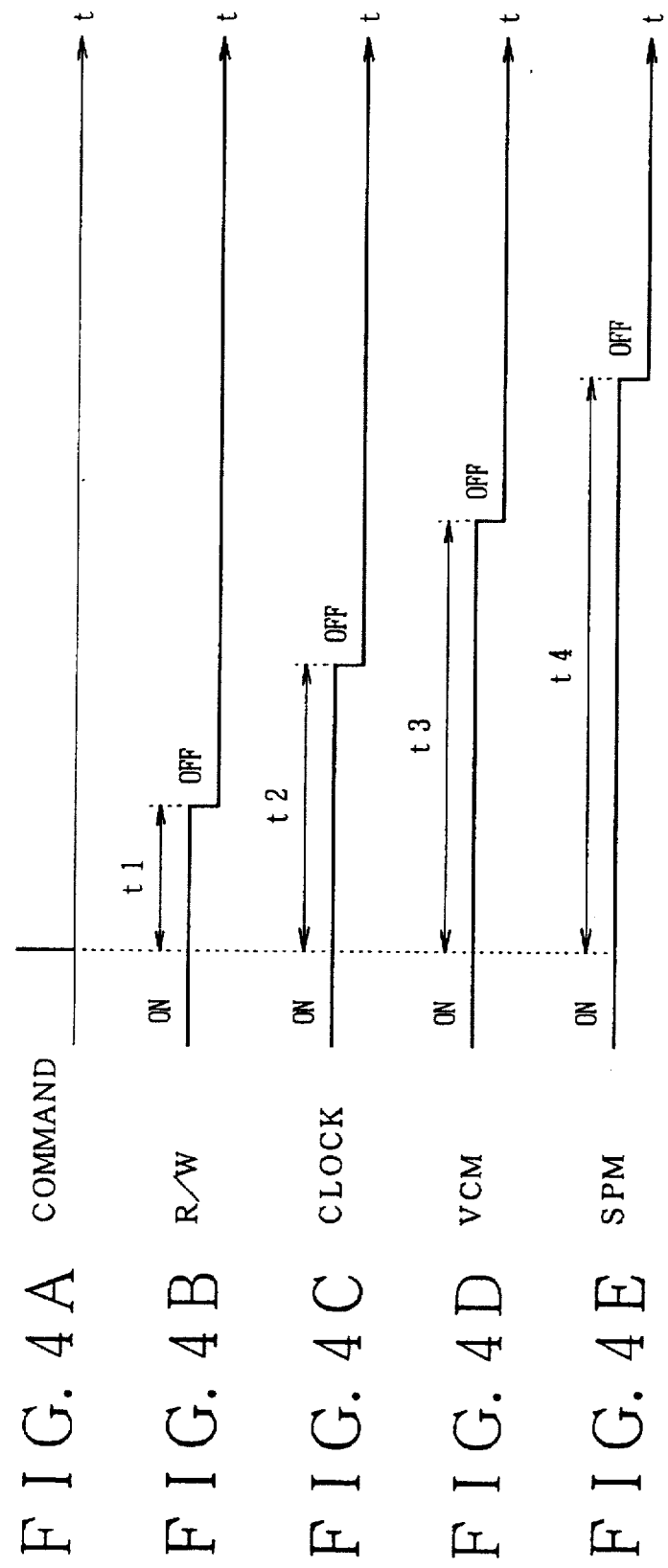

FIG. 11

| MEASUREMENT TIME T | MODE NO. | POWER SAVE CONTROL INFORMATION | | | |
|---|---|---|---|---|---|
| | | R/W CIRCUIT UNIT | CLOCK OSCILLATING CIRCUIT | VCM DRIVER | SPM/COOLING FAN |
| T<T1 | 1 | ○ | | | |
| T1≦T<T2 | 2 | ○ | ○ | | |
| T2≦T<T3 | 3 | ○ | ○ | ○ | |
| T≧T3 | 4 | ○ | ○ | ○ | ○ |

MEMORY APPARATUS

This application is a continuation of application Ser. No. 08/620,005 filed on Mar. 21, 1996 now abandoned.

BACKGROUND OF THE INVENTION

The invention relates to a memory apparatus of a disk apparatus or the like having a power saving function for reducing electric power consumption by stopping the power source or reducing the operating ability of an unnecessary circuit unit in a state in which a command from an upper apparatus is stopped and, more particularly, to a memory apparatus for optimizing power savings in accordance with the environment in which the apparatus is used.

In association with recent miniaturization of computers, it is more and more important to reduce an electric power consumption of a magnetic disk apparatus as a peripheral device and it is indispensable to efficiently reduce the electric power consumption. In the conventional magnetic disk apparatus, in order to reduce the electric power consumption, when a time when no command is received from the host reaches a predetermined time, a power save control for shutting off the power supply of a part or all of the circuits is performed. That is, a predetermined time is preset as a command stop time to shift to a power saving mode, and when a command is received, a time is counted by a counter, and when the counted time reaches a predetermined time, the power supply of a part or all of the circuits is stopped by the power save control. As a power save control, in case of the magnetic disk apparatus, there are the following cases: namely, a stop of a power supply of a read/write circuit unit; a reduction of an operating speed for decreasing a clock frequency of a processor to, for example, ½; a stop of a VCM for driving a head actuator; a stop of a driving of a spindle motor for rotating a disk medium; and the like.

In such power saving functions of the conventional disk apparatus, in order to reduce the electric power consumption, it is sufficient to shut off power sources of a larger number of circuit units. In this case, however, the return time when the power supply is turned on in response to the reception of the next command is long and there is a problem such that an accessing performance deteriorates. On the other hand, in case of constructing so as not to deteriorate the accessing performance by shutting off the power source of a circuit unit, as a target, whose return time is short, the electric power consumption cannot be sufficiently reduced. In the conventional power saving function, although the shift to the power saving mode is performed on the basis of a predetermined time which has fixedly been decided, a time interval for a command generation differs depending on a the environment use of the magnetic disk apparatus. Namely, the frequency at which the host needs to access the magnetic disk apparatus differs depending on the host. In case of the same host, on the other hand, there is a case where a difference occurs in the frequency due to an application which is used. There is, consequently, a problem such that it is difficult to properly determine the time to shift to the power saving mode. Further, in the case where the command is generated at a time interval which is slightly longer than the fixed value of the predetermined time to shift to the power saving mode, if the apparatus enters the power saving mode, the power saving mode is soon cancelled by the reception of the next command. Therefore, there is a fear such that the accessing performance remarkably deteriorates by the return time.

SUMMARY OF THE INVENTION

According to the invention, there are provided a memory apparatus of a disk apparatus or the like and its power saving method, in which a time interval of commands which are generated from an upper apparatus is monitored, the apparatus is shifted to a power saving mode at a proper timing, and an electric power consumption can be most efficiently reduced.

According to a memory apparatus of the invention, a time (T) of a command interval is measured by measuring means on the basis of the end/start timings of a command generated from an upper apparatus. Namely, the time (T) of the command interval from the timing when the execution of the command was finished to the timing when the next command is received is measured. Timing deciding means varies a timing for saving electric power consumption by the measurement time (T) of the command interval which was measured by the measuring means. After completion of the execution of the command received from the upper apparatus a, power save control means controls the apparatus to a power saving mode until the next command is obtained after the timing decided by the timing deciding means. The measuring means measures a plurality of command interval times of the commands generated from the upper apparatus and obtains a mean value. The timing deciding means decides a plurality of timings for performing the power saving on the basis of the mean value of the plurality of command interval times. The timing deciding means decides the plurality of timings for performing the power saving in accordance with the order of circuit units whose return times at the time of the power-on start are short for an increase in time of the command interval. The timing deciding means decides the timings for performing the power saving in accordance with the order of at least a read/write circuit unit, a circuit unit to drive a head, and a circuit unit to rotate a medium for an increase in time of the command interval. The timing deciding means can also decide the timings for performing the power saving in accordance with the order of at least the read/write circuit unit, a clock generating circuit of a processor, the circuit unit to drive the head, and the circuit unit to rotate the medium for an increase in time of the command interval. The timing deciding means can also select circuit units to be subjected to the power saving in accordance with the order of at least the read/write circuit unit, the clock generating circuit of the processor, the circuit unit to drive the head, the circuit unit to rotate the medium, and a circuit unit to drive a cooling fan for an increase in time of the command interval. Further, in the case where the measurement time of the command interval exceeds a predetermined maximum time, the timing deciding means can also decide the timings at which only the circuit units which can recognize the command reception from the upper apparatus are left and the other circuit units are set to targets for the power saving. The timing deciding means stores the measurement time (T) of the command interval into a non-volatile memory such as an EEPROM or the like or a memory medium and decides the timing for the power saving by using the measurement time of the command interval stored in the non-volatile memory or disk medium by the power-on start after the power source was turned off. In this case, the measurement time (T) of the command interval stored in the non-volatile memory or memory medium is updated every measurement by the measuring means.

According to the memory apparatus of the invention, the time of the command interval of the commands generated from the host is measured on the disk apparatus side, for example, a mean value of a plurality of times of the measurement is obtained, the timing of the circuit unit to be subjected to the power save control is decided in accordance with the measurement time of the command interval, and the power save control is executed. Namely, when the measurement time (T) of the command interval is short, power save timings t1 to t4 of a short interval are decided. When the measurement time (T) is long, the power save timings t1 to t4 of a long interval are decided. In any case, the power saving is performed in accordance with the order of the circuit units of the short return times. Therefore, even when the command intervals differ due to the operation environment, the power saving in which the timings for the power saving in the command interval are distributed on a time base at the same ratio is executed. A situation such that the timing for the power saving of the circuit unit is too late or too early due to a change in the command interval is avoided. The power saving which makes the most of the saving effect of the electric power consumption can be performed.

According to a modification of the invention, the time of the command interval is likewise measured by the measuring means as end/start timings of the command which is generated from the upper apparatus. That is, the time (T) of the command interval from the timing when the execution of the command was finished to the timing when the next command is received is measured. One or a plurality of circuit units to be subjected to the power saving are decided by the deciding means in accordance with the measurement time. After completion of the execution of the command received from the upper apparatus, the power save control means controls one or a plurality of circuit units decided by the deciding means to the power saving mode until the next command is obtained. In this case as well, the measuring means can also measure the time intervals of a plurality of commands generated from the upper apparatus and obtain the mean value. The deciding means increases the number of circuit units to be subjected to the power saving in accordance with the order of the circuit units of the short return times at the time of the power-on start for an increase in measurement time of the command interval. Specifically speaking, the deciding means increases the number of circuit units to be subjected to the power saving in accordance with the order of at least the read/write circuit unit, the circuit unit to drive the head, and the circuit unit to rotate the medium. It is also possible to increase the number of circuit units to be subjected to the power saving in accordance with the order of at least the read/write circuit unit, a clock generating circuit of a processor, the circuit unit to drive the head, and the circuit unit to rotate the medium. On the other hand, the number of circuit units to be subjected to the power saving can be also increased in accordance with the order of at least the read/write circuit unit, the clock generating circuit of the processor, the circuit unit to drive the head, the circuit unit to rotate the medium, and the circuit unit to drive the cooling fan. When the measurement time (T) of the command interval exceeds the predetermined maximum time, it is desirable that the deciding means operates in a manner such that only the circuit units which can recognize the command reception from the upper apparatus are left and all of the other circuit units are set to the targets of the power saving. Further, the measuring means stores the measurement time (T) of the command interval into the non-volatile memory such as an EEPROM or the like or the memory medium. The deciding means decides one or a plurality of circuit units to be subjected to the power saving by using the measurement time (T) stored in the non-volatile memory or memory medium by the power-on start after the power source was turned off. In this case, the measurement time (T) of the command interval stored in the non-volatile memory or memory medium is updated every measurement by the measuring means.

According to such a modification of the invention, the time of the command interval of the commands generated from the host is measured on the disk apparatus side, the number of circuit units to be subjected to the power saving is increased in accordance with an increase in measurement time, and one or a plurality of circuit units decided are power saved at the end time point of the execution of the command. For example, when the measurement time of the command interval is short, only the read/write circuit unit of the short return time is subjected to the power saving. In association with an increase in measurement time, the operating mode is shifted to the batch power saving mode of the read/write circuit unit and VCM driving circuit unit and the batch power saving mode of the read/write circuit unit, VCM driving circuit unit, and SPM driving circuit unit. Therefore, a proper low electric power consumption according to the use environment of the disk apparatus can be realized. A deterioration of the performance due to the realization of the low electric power consumption can be minimized.

The above and other objects, features, and advantages of the present invention will become more apparent from the following detailed description with reference to the drawings.

BRIEF DESCRIPTION OF THE DRAWINGS

FIGS. 3A and 3B are explanatory diagrams of decision contents of power save timings in FIG. 2;

FIGS. 4A to 4E are explanatory diagrams showing the correspondence between a measurement time (T) according to FIGS. 3A and 3B and power save timings t1 to t4;

FIG. 11 is an explanatory diagram of processing contents of a power save deciding unit in FIG. 10;

DETAILED DESCRIPTION OF THE PREFERRED EMBODIMENT

Figure 1:
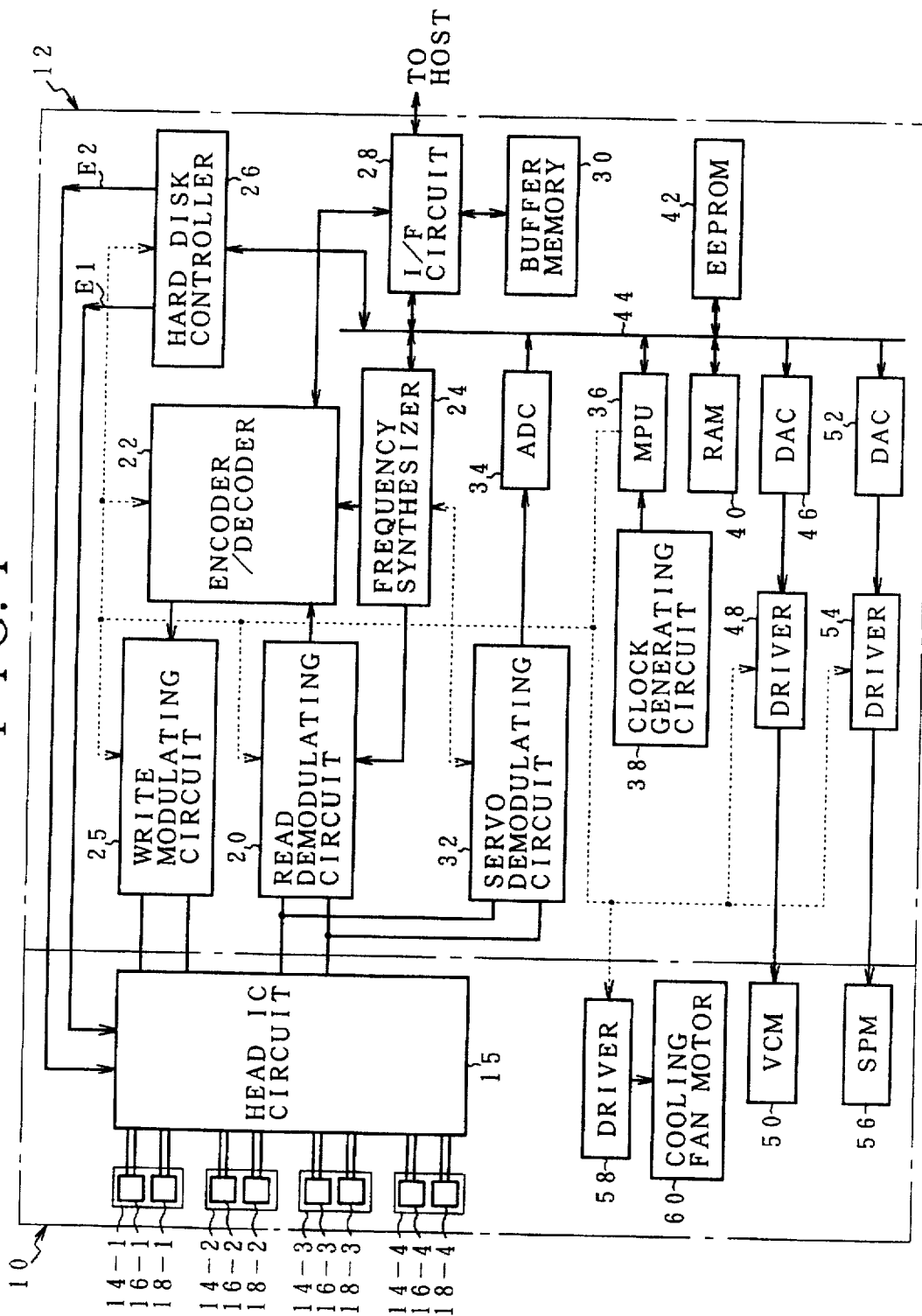
FIG. 1 is a block diagram showing an embodiment of a disk apparatus of the invention.

FIG. 1 is a block diagram of a magnetic disk apparatus to which a power save control of the invention is applied. In FIG. 1, a disk apparatus known as a disk drive is constructed by a disk enclosure 10 and a disk controller 12. A head IC circuit 15 is provided for the disk enclosure 10. In the embodiment, four combination heads 14-1 to 14-4 are connected to the head IC circuit 15. The combination heads 14-1 to 14-4 integratedly have write heads 16-1 to 16-4 and read heads 18-1 to 18-4, respectively. Inductive heads are used as write heads 16-1 to 16-4. MR heads are used as read heads 18-1 to 18-4. Further, a VCM 50 to drive a head actuator, a spindle motor 56 to rotate a magnetic disk, a cooling fan motor 60, and its driver circuit 58 are provided for the disk enclosure 10. The disk controller 12 is provided for the disk enclosure 10. A read demodulating circuit 20, an encoder/decoder 22, a write modulating circuit 25, a hard disk controller 26, an interface circuit 28, a buffer memory 30, a servo demodulating circuit 32, and an A/D converter 34 are provided as a read/write circuit unit for the disk controller 12. In the reading mode, the hard disk controller 26 transmits a head switching signal E1 based on a command from an upper apparatus and a signal to make the reading side of a read/write switching signal E2 effective to the head IC circuit 15. The hard disk controller also selects either one of the combination heads 14-1 to 14-4, and connects the read head to the read demodulating circuit 20. A read signal from the read head is AGC amplified to a predetermined amplitude by the read demodulating circuit 20. After that, read data is demodulated by, for example, a $(1+D)^m$ waveform equalization (m denotes a restraint length of a convolutional code) according to a partial response maximum likelihood detecting method and by a Viterbi decoding which is subsequently performed. As for the read data demodulated by the read demodulating circuit 20, since the decoding function of the encoder/decoder 22 is effective upon reading, NRZ data is decoded from RLL data and is parallel converted. After that the data is transferred to the buffer memory 30 through the interface circuit 28. When a storage amount of the buffer memory 30 exceeds a predetermined value, the read data is transferred to an upper apparatus via the interface circuit 28. In the writing mode, the write data from the upper apparatus which was transferred to the buffer memory via the interface circuit 28 is sent to the encoder/decoder 22. In the writing mode, since the encoding function is effective, the NRZ write data is converted to a predetermined RLL code and is outputted to the write modulating circuit 25. In case of the partial response maximum likelihood detection, after a precoding of $1/(1+D)^m$ was performed, the write modulating circuit 25 executes a write compensation. After the data was held by a write FF, it is supplied to the write head selected at that time through the head IC circuit 15 by a driver and is written to the disk medium. Since a constant density recording (CDR) is used in the embodiment, a frequency synthesizer 24 divides cylinders of the disk medium into zones every predetermined number of cylinders. A different frequency has been preset for every zone. Therefore, by setting the corresponding zone frequency from a cylinder address in the reading or writing mode, a clock is supplied to the read demodulating circuit 20, encoder/decoder 22, and the like. The entire control of the disk controller 12 is executed by an MPU 36. A RAM 40 is connected to the MPU 36 through a bus 44. An EEPROM 42 is further connected as a non-volatile memory to the MPU 36. The interface circuit 28 is further connected to the MPU 36 through the bus 44. Various commands from the upper apparatus are received and decoded and a read/write instruction to the hard disk controller 26 is performed. Further, a head positioning control by the driving of the VCM 50 provided for the disk enclosure 10 is executed. To drive the VCM 50, a D/A converter 46 and a driver 48 are provided for the bus 44 and control the VCM 50 by an instruction from the MPU 36. The spindle motor 56 is also driven by a D/A converter 52 and a driver 54. A position signal for the head positioning control by the MPU 36 is obtained from the servo demodulating circuit 32 and A/D converter 34. In the embodiment, a sector servo in which servo information, for example, 2-phase servo information has been recorded at a head position of each sector on a data surface of the disk medium is used. Therefore, the read signal from the write head selected by the head IC circuit 15 is inputted to the servo demodulating circuit 32 in the reading or writing mode and the position signal is demodulated at the timing of the servo information and is supplied to the MPU 36 by the A/D converter 34. As a servo control by the MPU 36, a seek control to move the head to the cylinder address designated by the command and a fine control when the cylinder reaches a target cylinder are executed. Further, a clock generating circuit 38 is provided for the MPU 36. The clock generating circuit 38 frequency divides an oscillation signal from a quartz oscillator by a frequency dividing circuit and generates a clock signal of a predetermined frequency which is necessary for the operation of the MPU 36. In such a disk apparatus of the invention constructed by the disk enclosure 10 and disk controller 12 as mentioned above, a function to realize the power save control to reduce the electric power consumption in the command stop state from the upper apparatus is further provided for the MPU 36.

Figure 2:
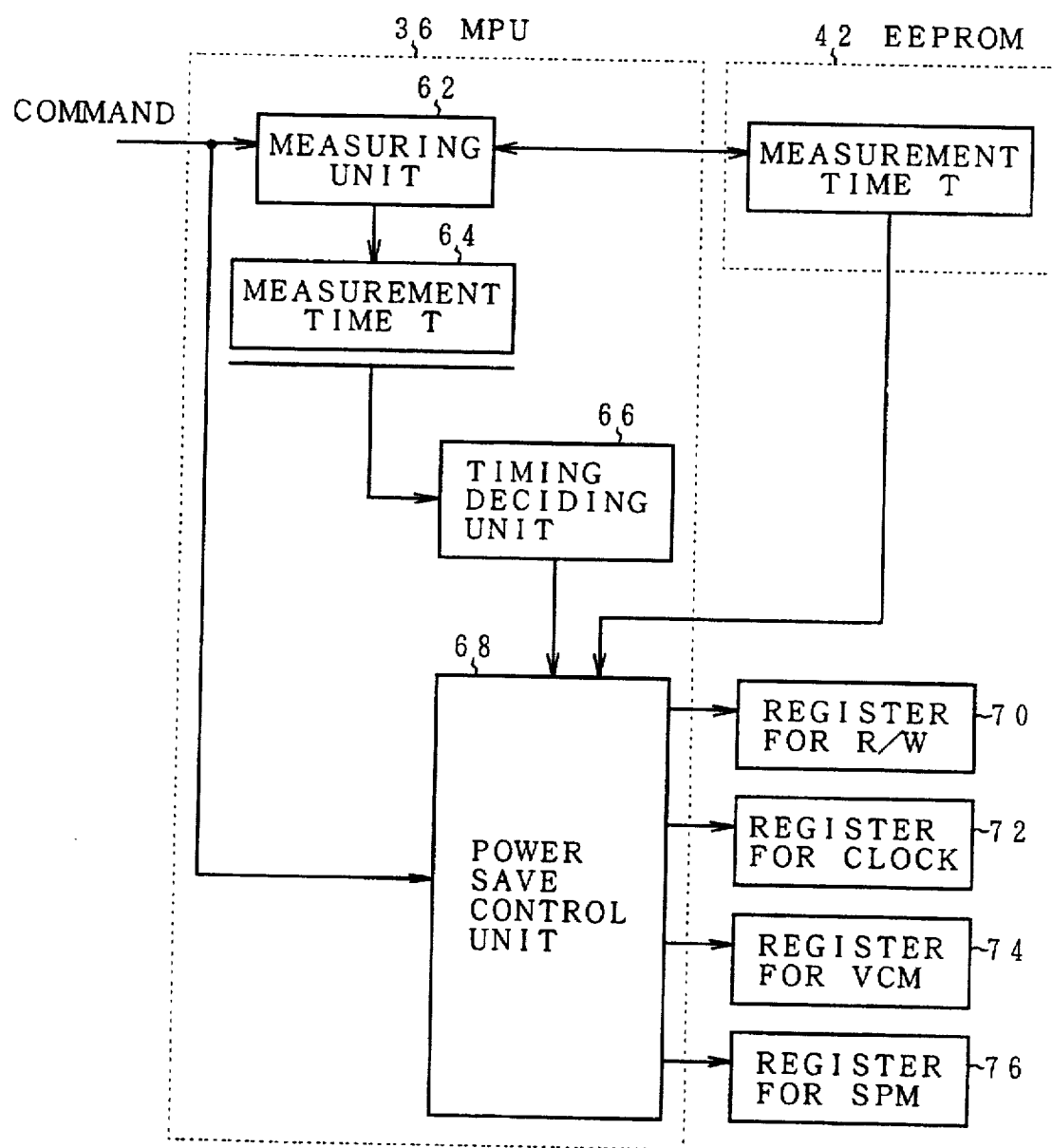
FIG. 2 is a functional block diagram of a power save control of the invention which is realized by an MPU in FIG. 1.

FIG. 2 is a functional block diagram of the power save control of the invention which is realized by the MPU 36 in FIG. 1. A measuring unit 62 to measure a time (T) of a command interval is provided for the MPU 36. When a command from the upper apparatus is received, the measuring unit 62 resets and starts a counter. When the next command is received, the counter is stopped. The measuring unit 62 measures the time (T) of the command generation interval from the count value of the counter. The time measurement of the command interval by the measuring unit 62 is executed a predetermined number (N) times. After completion of the measurement (N) times, the mean value is obtained and set as a measurement time (T) into a measuring register 64. The measurement time (T) of the measuring unit 62 is also stored into the EEPROM 42 provided as a non-volatile memory. Subsequent to the measuring unit 62, a timing deciding unit 66 to decide a timing ti (i=1, 2, 3, . . . , n) for the power saving in accordance with the measurement time (T) is provided. In the embodiment, the timing deciding unit 66 decides four timings t1 to t4 in accordance with the measurement time (T) in correspondence to four circuit units divided as targets of the power saving.

FIGS. 3A and 3B show an embodiment of the processing contents of the timing deciding unit 66 in FIG. 2. In FIG. 3A, different power save contents are first determined in accordance with the duration of the measurement time (T). Namely, the power save contents are decided by dividing the measurement time (T) to long, middle, and short times. For example, when the measurement time (T) of the command interval is less than 5 seconds, the power saving is not performed. When the measurement time (T) is equal to or longer than 5 seconds and is less than 30 seconds, the timings t1 to t4 multiplied with predetermined coefficients of the measurement time are obtained. In this case, t1=1.08T, t2=1.0T, t3=1.2T, and t4=1.4T. Further, when the measurement time (T) is equal to or longer than 30 seconds, the timings t1 to t4 which are fixedly determined are used. For example, t1=1 second, t2=10 seconds, t3=30 seconds, and t4=60 seconds.

FIG. 3B shows the relation between the timings t1 to t4 in FIG. 3A and the circuit units as targets of the power saving. As power save target circuit units, the disk apparatus of FIG. 1 is divided into four circuit units of the read/write circuit unit (R/W circuit unit), clock generating circuit, VCM driver, and SPM/cooling fan. The read demodulating circuit 20, encoder/decoder 22, frequency synthesizer 24, write modulating circuit 25, hard disk controller 26, and servo demodulating circuit 32 in FIG. 1 are included in the R/W circuit unit. The clock generating circuit is nothing but the clock generating circuit 38. The VCM driver is the driver 48. Further, the SPM/cooling fan corresponds to the drivers 54 and 58. The power save circuit unit in FIG. 3B is decided by the mode numbers 1 to 4 and a mark "o" in the corresponding frame denotes that the circuit units shown by "o" are the circuit units as targets of the power saving at the timings t1 to t4. The circuit units as targets of the power saving are made to correspond to the timings t1 to t4 in accordance with the order from the circuit unit in which a return time which is required until the circuit unit is returned to the normal operating state after the power-on is short. Namely, the return time at the time of the power-on of the R/W circuit unit is the order of microseconds and the R/W circuit unit can be instantaneously returned to the operating state. In the case of the clock generating circuit 38, since a frequency dividing ratio is changed and a clock period is set to a long time in the power saving mode, the return time to return the circuit unit to the operating state is also equal to the order of microseconds, so that the clock generating circuit can be soon returned to the operating state. On the other hand, in the case of the driver 48 of the VCM 50, a return time of, for example, about 100 to 200 msec. is needed to return from a power shut-off state to a state in which the servo control can be normally performed. Further, as for the driver 54 and spindle motor 56, a relatively long return time of, for example, about three seconds is needed until the disk medium reaches a predetermined rotational speed by the power-on. With respect to the cooling fan motor 60, the return time at the time of the power-on does not cause a problem in particular. Therefore, in the case where the timings t1 to t4 for the power saving are decided in accordance with the measurement time (T) of the command interval, in response to a command of FIG. 4A, the power saving is executed in accordance with the order of the R/W circuit unit, clock generating circuit, VCM driver, and SPM/cooling fan in accordance with the timings t1 to t4 in FIGS. 4B to 4E. That is, when reaching the timing t1 of FIG. 4B, the power saving to shut off the power source of the R/W circuit unit is performed. When reaching the timing t2 in FIG. 4C, the power saving in which the operating speed of the MPU 36 is reduced by changing the frequency dividing ratio of the clock generating circuit 38 in addition to the power shut-off of the R/W circuit unit is performed. When reaching the timing t3 in FIG. 4D, the power saving in which the power supply to the driver 48 to drive the VCM 50 is stopped in addition to the power shut-off of the R/W circuit unit and the reduction of the operating speed of the MPU 36 by changing the frequency dividing ratio of the clock generating circuit is performed. In case of stopping the power supply to the driver 48 of the VCM 50, the head is returned to a CSS (Contact Start/Stop) zone before the stop of the power supply and, after that, the power supply of the VCM is shut off. Further, when reaching the timing t4 in FIG. 4E, the power supply to the driver 54 of the spindle motor 56 is stopped, the power supply to the driver 58 to drive the cooling fan motor 60 is stopped, and the power supply to almost the entire circuit unit of the disk controller 12 is stopped. The circuit units which operate after the timing t4 are only the circuit units such as MPU 36 which operates at a low speed by setting a period to a long period, RAM 40, EEPROM 42, interface circuit 28, and buffer memory 30 and which are at least necessary for access from the upper apparatus. Now, assuming that a power source voltage is equal to, for example, 5V, a consumption current of 500 mA flows, so that electric power consumption in the disk enclosure 10 and disk controller 12 in FIG. 1 is equal to 2.5W. With this electric power consumption, a current of 150 mA is needed to drive the spindle motor 56 by the driver 54, a current of 100 mA is needed to drive the VCM 50 by the driver 48, and a current of 250 mA is needed for the other circuit units. When considering a ratio of the currents which are consumed by those circuit units, according to the power saving of the timings decided in accordance with FIG. 3, degrees at which the consumption currents can be saved are set to be larger in accordance with the order of the timings t1 to t4.

Referring again to FIG. 2, a power save control unit 68 is provided subsequent to the timing deciding unit 66. The power save control unit 68 monitors the timings t1 to t4 decided by the timing deciding unit 66 in accordance with the measurement time (T) and the elapsed time from the end of the execution of the received command. Each time the timing reaches any one of t1 to t4, the power saving of the circuit unit according to any one of the modes 1 to 4 which has been set at that time is executed. Specifically speaking, a power save control line shown by a broken line is connected from the MPU 36 to the circuit unit as a power saving target in the disk controller 12 in FIG. 1. The power save control line sets and resets bit data for the register to control the power saving of each circuit unit. For example, in the power save control unit 68 in FIG. 2, bit data for a register 70 for reading/writing, a register 72 for generating a clock, a register 74 for the VCM, and a register 76 for the SPM which are provided in correspondence to the power saving circuit units at the timings t1 to t4 in FIG. 3B is set and reset.

Figure 5:
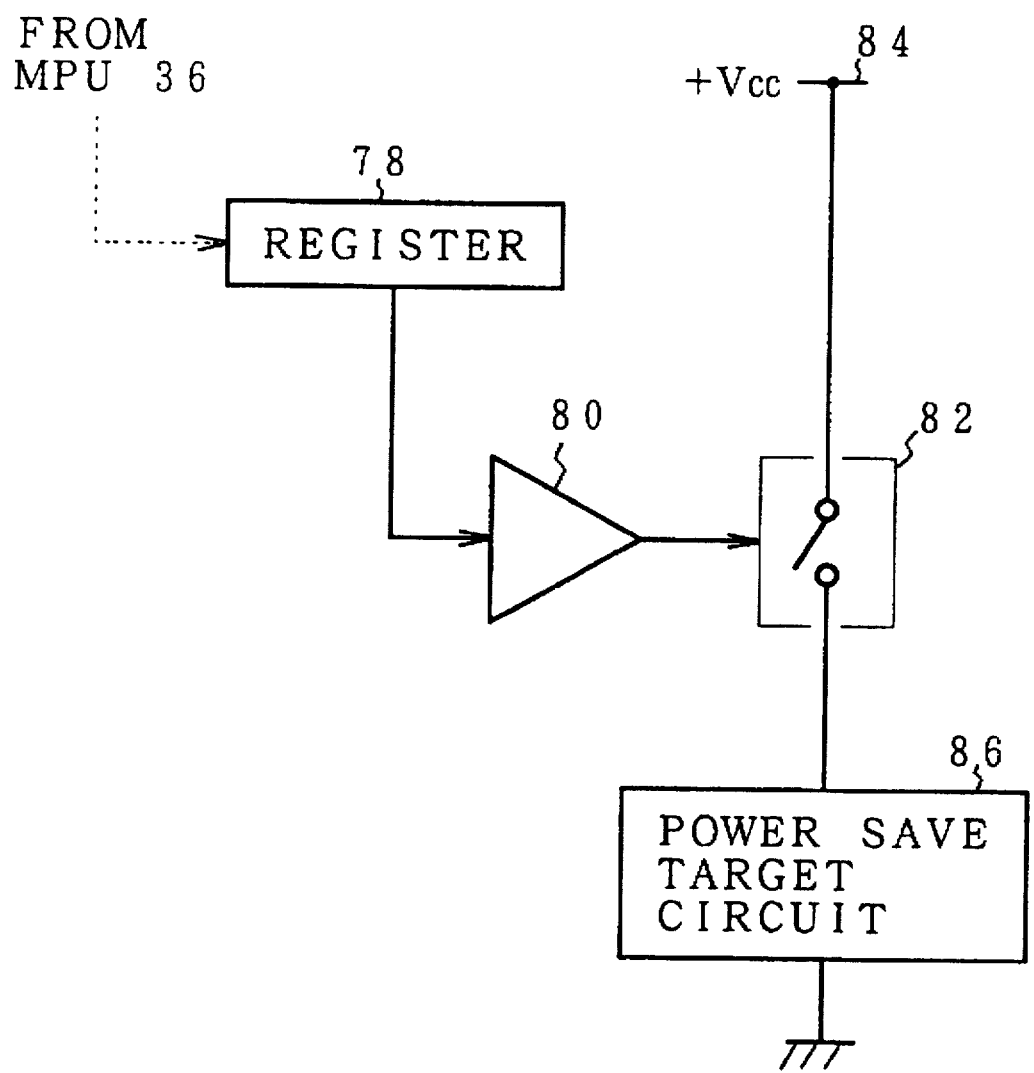
FIG. 5 is a block diagram of a power source control circuit of a power save target circuit unit in FIG. 1.

FIG. 5 shows a general form of an embodiment of a circuit to perform the power saving due to the shut-off of the power supply by the power save control unit 68 in FIG. 2. A power source line 84 is connected to a power save target circuit 86 through an analog switch 82. A register 78 is provided for the power save target circuit 86. Bit data 1 is set by the MPU 36 in the power save control. Control bit 1 set in the register 78 is inputted to a driver 80, thereby switching the analog switch 82 to the OFF state as shown in the diagram. Thus, the power supply to the power save target circuit 86 is stopped and the apparatus enters the power saving mode. In case of cancelling the power saving mode, by setting data bit 0 into the register 78 by the MPU 36, the analog switch 82 is returned to the ON state by the driver 80 and the power supply to the power save target circuit 86 is restarted.

Figure 6:
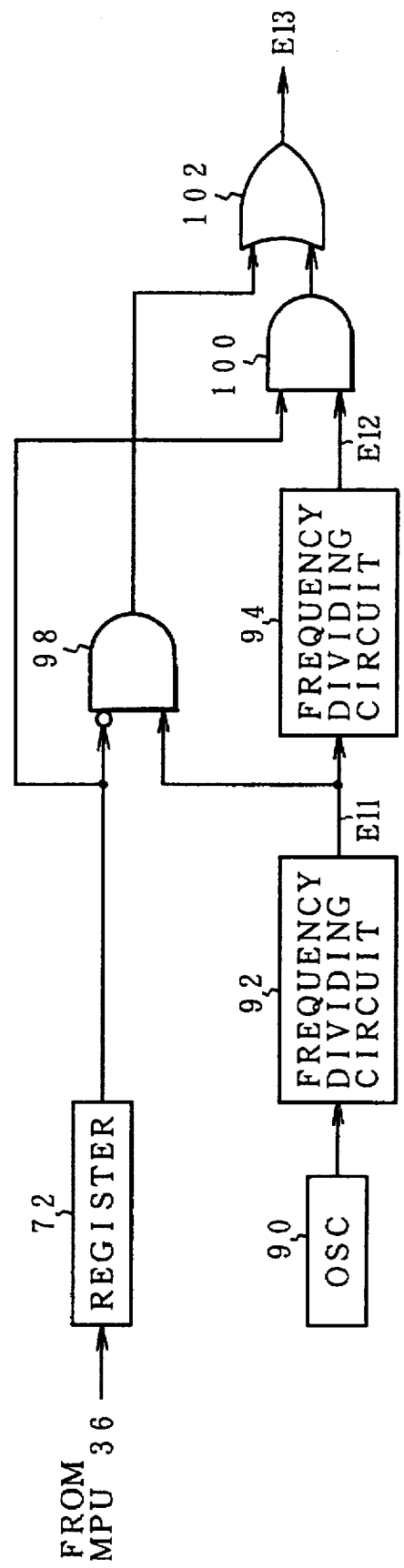
FIG. 6 is a block diagram of a clock generating circuit in FIG. 1.

FIG. 6 is a circuit construction for the power saving in the clock generating circuit 38 in FIG. 1. The clock generating circuit 38 has a quartz oscillator 90. After an oscillation signal from the quartz oscillator 90 was waveform shaped, it is divided into a predetermined clock frequency, for example, 60 MHz which is necessary for the MPU 36 by a frequency dividing circuit 92. An output of the frequency dividing circuit 92 is sent to a frequency dividing circuit 94 and is further divided into 30 MHz, that is the half of 60 MHz. On other hand, the register 72 in which the bit data is set and reset by the power save control from the MPU 36.

Figure 7:
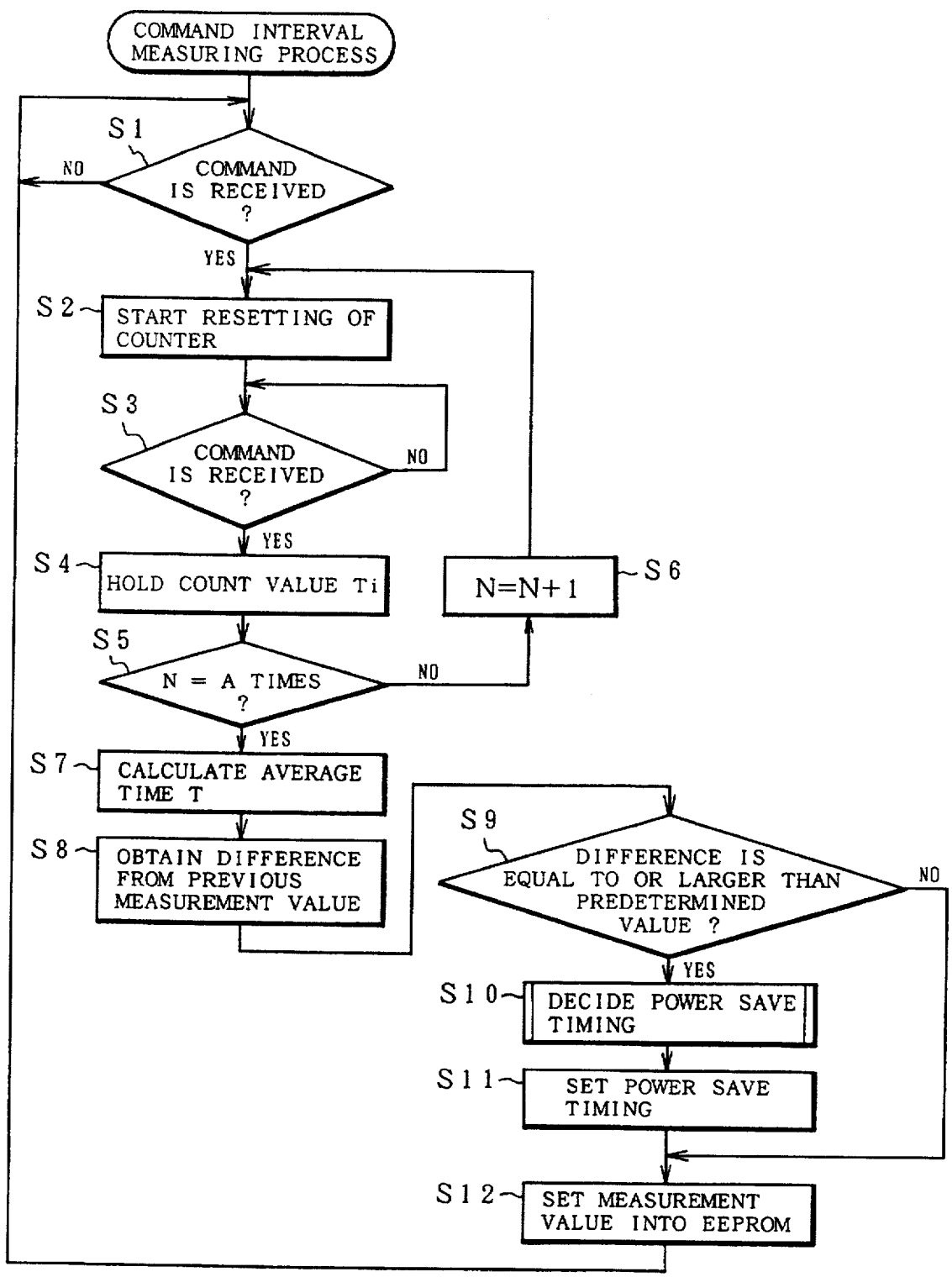
FIG. 7 is a flowchart for a command interval measuring process in FIG. 2.

An output of the register 72 is connected to an inversion input of an AND circuit 98 and is also directly inputted to an AND circuit 100. The frequency dividing clock E1 of 60 MHz from the frequency dividing circuit 92 is inputted to the AND circuit 98. The frequency dividing clock E2 of 30 MHz from the frequency dividing circuit 94 is inputted to the AND circuit 100. Outputs of the AND circuits 98 and 100 are supplied to an OR circuit 102. An output of the OR circuit 102 is supplied as a clock E13 to the MPU 36. In a set state of data bit 0 of the register 72 after the power saving mode was cancelled, the AND circuit 98 is in a permission state and the AND circuit 100 is in an inhibition state, so that the frequency dividing clock E1 of 60 MHz from the frequency dividing circuit 92 is supplied to the MPU 36 through the AND circuit 98 and OR circuit 102. On the other hand, when data bit 1 is set into the register 72 for the purpose of the power save control, the AND circuit 98 is set to the inhibition state and the AND circuit 100 is set to the permission state, so that the frequency dividing clock E2 of 30 MHz from the frequency dividing circuit 94 is supplied to the MPU 36 through the AND circuit 100 and OR circuit 102. In FIG. 7, although the oscillation signal has been frequency divided to 30 MHz that is equal to ½ of 60 MHz by the frequency dividing circuit 94, it can be further frequency divided to a low speed clock of, for example, 10 MHz, 5 MHz, or the like.

In FIG. 2, moreover, the measurement time (T) measured by the measuring unit 62 is stored into the EEPROM 42 and is updated every measurement. Therefore, in case of again activating after the power source of the disk apparatus was shut off, a power save timing at the time of the recovery of the power source can be determined by the timing deciding unit 66 by using the measurement time (T) before the power supply is stopped which has been held in the EEPROM 42. In such a holding of the measured value for the stop of the power supply, for example, the value can be also written into a designated area of the disk medium instead of the EEPROM 42.

FIG. 7 is a flowchart for the measuring process by the measuring unit 62 in FIG. 2. First in step S1, a check is made to see if the command from the upper apparatus has been received. When the command is received, step S2 follows and the counter is reset, thereby allowing the time counting operation to be started. In step S3, a check is made to see if the next command has been received. When the command is received, the operation of the counter is stopped. In step S4, a count value Ti at that time is held into the RAM or the like. In step S5, a check is made to see if the number (N) of measuring times has reached a predetermined number (A). When (N) is less than (A), the number (N) of measuring times is increased by "1" in step S6. After the counter was reset, the counting operation of the counter is again started in step S2. In a manner similar to the above, the same processes are repeated each time the command is received. The counter value Ti as a time of the command interval at that time is held. When (N) reaches (A) in step S5, step S7 follows and the mean measurement time (T) of measured values T1, T2, . . . , and TN held in the RAM or the like is calculated. In step S8, the difference between the previous measurement time stored in the EEPROM 42 and the current measurement time is obtained. In step S9, when the difference between the measurement times is equal to or larger than a predetermined value, the processing routine advances to step S10. The timings t1 to t4 according to the measurement time are determined by the timing deciding unit 66 on the basis of the contents of FIGS. 3A and 3B. The timings t1 to t4 are set into the power save control unit 68 in step S11. In step S12, the current measurement time (T) is set into the EEPROM 42 and is updated.

Figure 8:
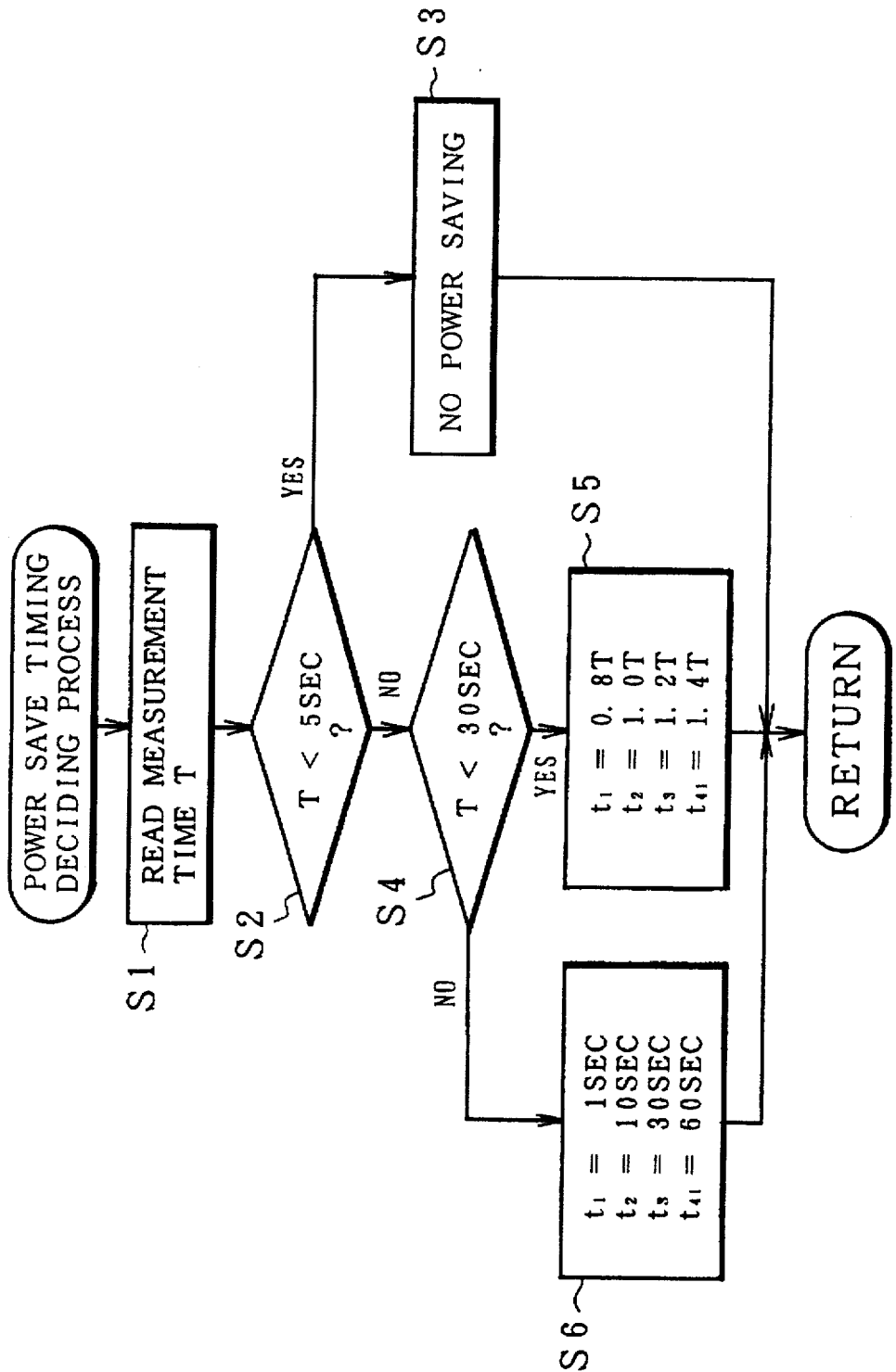
FIG. 8 is a flowchart showing a power save timing deciding process in FIG. 7 by a subroutine.

FIG. 8 shows a power save timing deciding process in step S10 in FIG. 7 as a subroutine. The subroutine relates to the contents of FIGS. 3A and 3B as targets. First in step S1, the measurement time (T) is read. In step S2, a check is made to see if the measurement time is less than 5 seconds. When it is less than 5 seconds, step S3 follows. In this case, a mode in which the power saving is not performed is determined. When the measurement time (T) is equal to or longer than 5 seconds in step S2, a check is made in step S4 to see if (T) is less than 30 seconds. When it is less than 30 seconds, the timings t1 to t4 are determined by multiplying predetermined coefficients 0.8, 1.0, 1.2, and 1.4 to the measurement time (T) in step S5. When (T) is equal to or longer than 30 seconds in step S4, step S6 follows and the timings t1 to t4 which have fixedly been set are decided.

Figure 9:
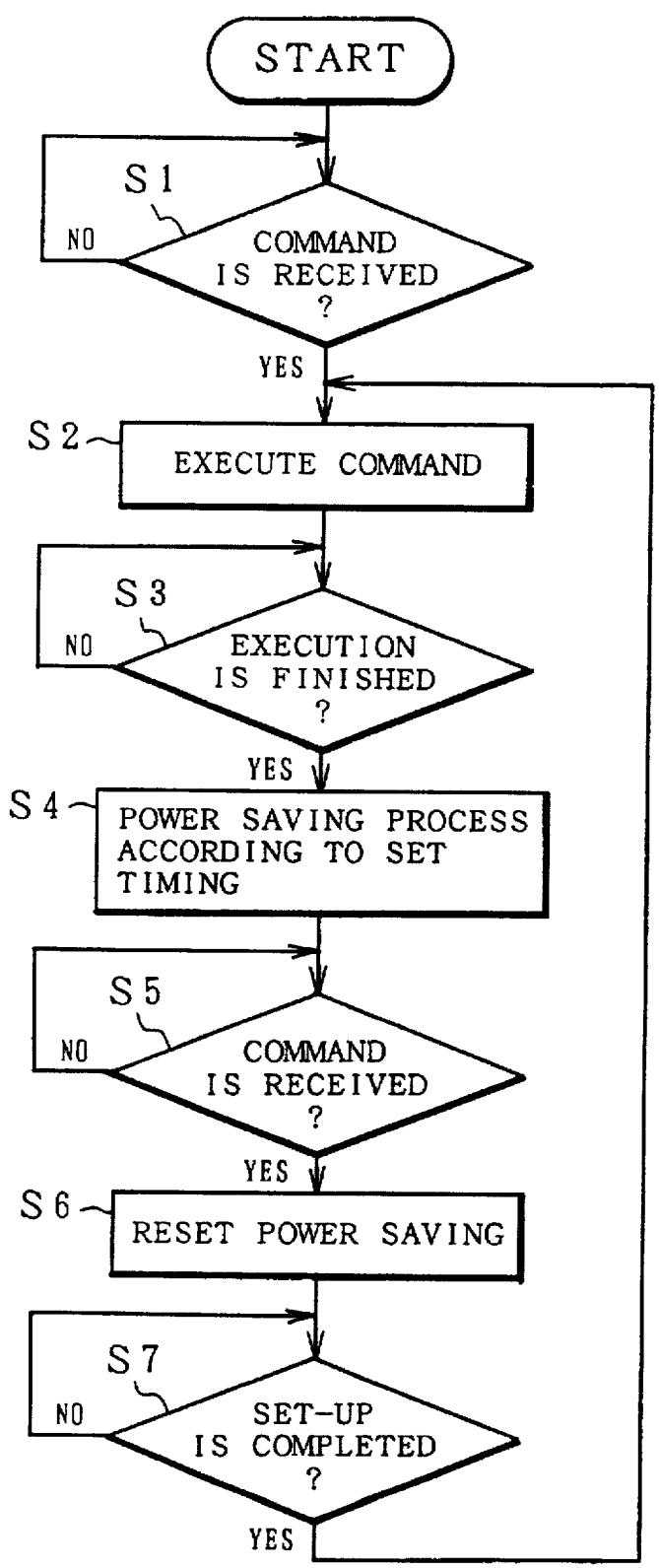
FIG. 9 is a flowchart for a power save control in FIG. 2.

A flowchart of FIG. 9 shows processes of the power save control unit 68 in FIG. 2. First in step S1, a check is made to see if the command from the upper apparatus has been received. When the command is received, step S2 follows and the command is interpreted and executed. In step S3, a check is made to see if the execution of the command has been finished. When the end of the execution is discriminated, step S4 follows. The power saving process according to any one of the timings t1 to t4 which was decided by the timing deciding unit 66 is executed in accordance with the measurement time (T) of the command interval at that time. Namely, data bit 1 is set into the registers of the circuit units designated as targets of the power saving at each of the timings t1 to t4, thereby shutting off the power supply. Among the target circuit units, with respect to the clock generating circuit 38, by switching the frequency dividing clock, the clock frequency is reduced and the operating speed of the MPU 36 is reduced, thereby decreasing the electric current consumption. In step S5, a check is made to see if the command from the upper apparatus has been received during the power saving mode. When the command is received, step S6 follows and the power saving mode is reset, namely, data bit 0 is set into the register of each circuit unit, thereby restarting the power supply and recovering the clock frequency. In step S7, a check is made to see if the set-up in association with the power save reset has been completed. When the completion of the set-up is confirmed, step S2 follows and the command received in the power saving mode is analyzed and the corresponding process is executed. In such a power save control of the invention, when the measurement time (T) of the command interval is short, the power save timings t1 to t4 of short intervals are determined. When the measurement time (T) is long, the power save timings t1 to t4 of long intervals are determined. In any case, the power saving is executed in accordance with the order of the circuit units of short return times. Therefore, even if the command intervals differ due to the operation environment, the power saving in which the timings of the power saving in the command interval are distributed onto the time base at the same ratio is executed. A situation such that the timing of the power saving of the circuit unit is made too late or early due to a change in command interval can be avoided. Therefore, the power saving which makes the most of the saving effect of the electric power consumption can be performed.

Figure 10:
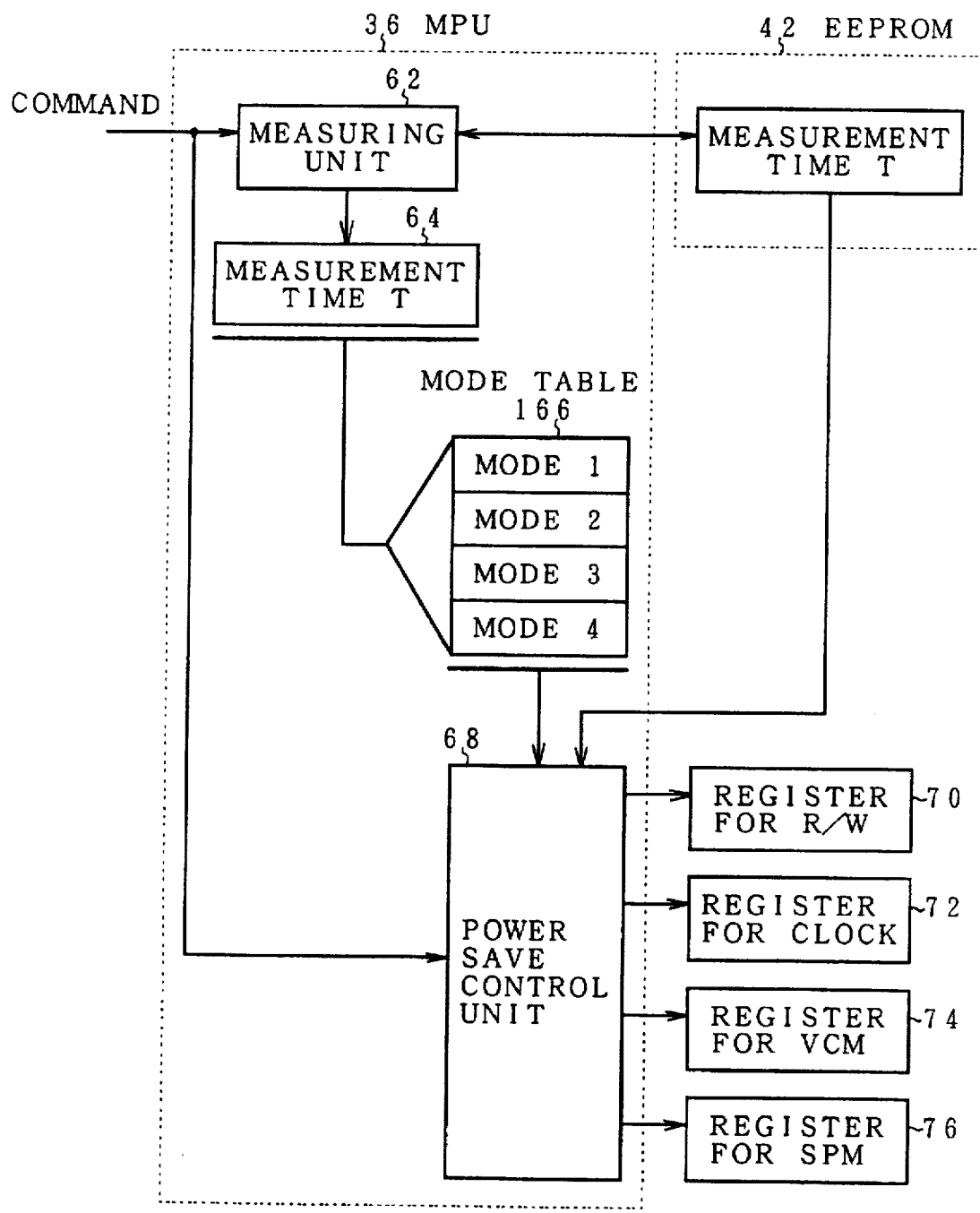
FIG. 10 is a functional block diagram of a power save control according to a modification of the invention which is realized by the MPU in FIG. 1.

FIG. 10 is a functional block diagram of the power save control according to a modification of the invention that is realized by the MPU 36 in FIG. 1. In FIG. 10, the measuring unit 62 is provided for the MPU 36. When the command is received from the upper apparatus, the measuring unit 62 resets and starts the counter. When the next command is received, the measuring unit 62 stops the counting operation of the counter and measures the time (T) of the command generating interval from the count value of the counter. The measurement of the measuring unit 62 is executed a predetermined number (N) of times. After completion of the measurement of (N) times, a mean value of the measurement values is obtained and is set as a measurement time (T) into the measuring register 64. The measurement time (T) of the measuring unit 62 is also stored in the EEPROM 42 provided as a non-volatile memory. Subsequent to the measuring unit 62, a mode table 166 as deciding means for deciding the power saving mode on the basis of the measurement time (T) is provided. In the embodiment, for example, control information of four power saving modes of modes 1 to 4 has been registered in the mode table 166.

FIG. 11 shows an embodiment of the mode table in FIG. 10. First, threshold times T1, T2, and T3 are determined as table addresses for the measurement time (T). In the mode 1, a time zone less than T1 is set as an address. In the mode 2, a time zone which is equal to or larger than T1 and is less than T2 is set as an address. In the mode 3, a time zone which is equal to or larger than T2 or is less than T3 is set as an address. In the mode 4, a time zone which is equal to or larger than T3 is set as an address. In correspondence to the mode numbers 1 to 4 according to an increase in measurement time (T) of the command interval, the disk apparatus in FIG. 1 is divided into four circuit units of the R/W circuit unit, clock generating circuit, VCM driver, and SPM/cooling fan as power save control information and are set to the circuit units as targets of the power saving. The disk apparatus is divided into the circuit units by a method similar to that in case of the first invention of FIG. 2. The power save control information in the mode table of FIG. 11, with regard to the mode numbers 1 to 4, a mark "o" in the corresponding frame denotes that the circuit unit shown by the mark "o" becomes the target circuit unit of the power saving in the relevant mode. The circuit units as targets of the power saving are determined so that the number of circuit units as targets of the power saving increases with an increase in the command time interval (T). In response to the increase in measurement time (T) of the command interval, the number of circuit units as targets of the power saving is increased in accordance with the order of the circuit units of short return times which are required until the circuit units enter the normal operating states after the power-on. That is, the return time of the R/W circuit unit at the time of the power-on is on the order of microseconds and the R/W circuit unit can be instantaneously returned to the operating state. In case of the clock generating circuit 38, since the frequency dividing ratio is changed in the power saving mode and the clock period is increased, the clock generating circuit 38 can be also returned to the original operating state in the return time on the order of microseconds. On the other hand, in case of the driver 48 of the VCM 50, in order to recover the servo control of the VCM 50 from the power shut-off state to the normal operating state, for example, a return time of about 100 to 200 msec is needed. Further, with respect to the driver 54 and spindle motor 56, a relatively long return time of, for example, about 3 seconds is needed until the disk medium reaches a predetermined rotational speed by the power-on. With regard to the cooling fan motor 60, the return time at the time of the power-on does not particularly cause a problem.

As threshold times T1 to T3 to divide the measurement time (T) of the command interval into the mode numbers 1 to 4, for example, T1=5 seconds, T2=30 seconds, and T3=60 seconds are used. That is, at the stage when the measurement time (T) is so short to be less than (T1=5 sec), the power save control of the mode No. 1 in which the power source of only the R/W circuit unit of an extremely short return time is shut off is executed. In a range where the measurement time (T) is equal to or larger than (T1=5 sec) and is less than (T2=30 sec), in addition to the power shutoff of the R/W circuit unit, as shown in the mode No. 2, the frequency dividing ratio of the clock generating circuit 38 is changed and the operating speed of the MPU 36 is reduced. In this case as well, although longer than that in the mode 1, the return time when the next command is received is sufficiently short. Further, in a range where the measurement time (T) is equal to or larger than (T2=30 sec) and is less than (T3=60 sec), the apparatus is in the use environment in which the command generating time interval is fairly long. Therefore, in addition to the shut-off of the power source of the R/W circuit unit and the reduction of the operating speed of the MPU 36 by changing the frequency dividing ratio of the clock generating circuit, the power supply to the driver 48 to drive the VCM 50 is stopped. Before the power supply to the driver 48 of the VCM 50 is stopped, the head is returned to the CSS (contact start stop) zone. Further, in case of a long command interval during which the measurement time (T) is equal to or larger than (T3=60 sec), it is judged that the command generation to the magnetic disk apparatus is stopped for a fairly long time. In this mode No. 4, in addition to the operations in the mode 3, further, the power supply to the driver 54 of the spindle motor 56 is stopped, the power supply to the driver 58 to drive the cooling fan motor 60 is stopped, and the power supply to almost the entire circuit unit of the disk controller 12 is stopped. Namely, the circuit units which operate in the mode No. 4 are only the circuit units such as MPU 36 which operates at a low speed by setting the operating period to a long period, RAM 40, EEPROM 42, interface circuit 28, and buffer memory 30 which are at least necessary for the access from the upper apparatus. As for an electric power consumption in the disk enclosure 10 and disk controller 12 in FIG. 1, for example, assuming that the power source voltage is equal to 5V, a consumption current of 500 mA flows, so that the electric power consumption is equal to 2.5W. In this electric power consumption, a current of 150 mA is needed to drive the spindle motor 56 by the driver 54. A current of 100 mA is needed to drive the VCM 50 by the driver 48. A current of 250 mA is needed for the other circuit units. When considering a ratio of the consumption currents of the circuit units, according to the power save control information in the mode Nos. 1 to 4 in the mode table of FIG. 11, degrees at which the consumption currents can be saved are larger in accordance with the order of the mode Nos. 1 to 4.

Referring again to FIG. 10, subsequent to the mode table 166, the power save control unit 68 is provided. The power save control information in FIG. 11 in any one of the modes 1 to 4 selected with reference to the mode table 166 by the measurement time (T) of the measuring unit 62 is set into the power save control unit 68. In the set state of the power save control information, the power save control unit 68 monitors the end of the execution of the command received. When the execution of the command is finished, the power save control according to the power control information which was set at that time is performed. Specifically speaking, the power save control line shown by a broken line is connected from the MPU 36 to the circuit unit as a target of the power saving in the disk controller 12 in FIG. 1. The power save control line sets and resets the bit data for the register to control the power saving of each circuit unit. For example, in the power save control unit 68 in FIG. 10, in correspondence to the contents of the power save control in FIG. 11, the bit data is set and reset for the register 70 for reading and writing, register 72 for the clock generating circuit, register 74 for the VCM, and register 76 for the SPM. In the embodiment of the circuit for performing the power saving by the shut-off of the power supply by the power save control unit 68, the circuit of FIG. 5 shown as a general form is used. The circuit of FIG. 6 is used as a circuit for the power saving in the clock generating circuit 38 in FIG. 1.

Figure 12:
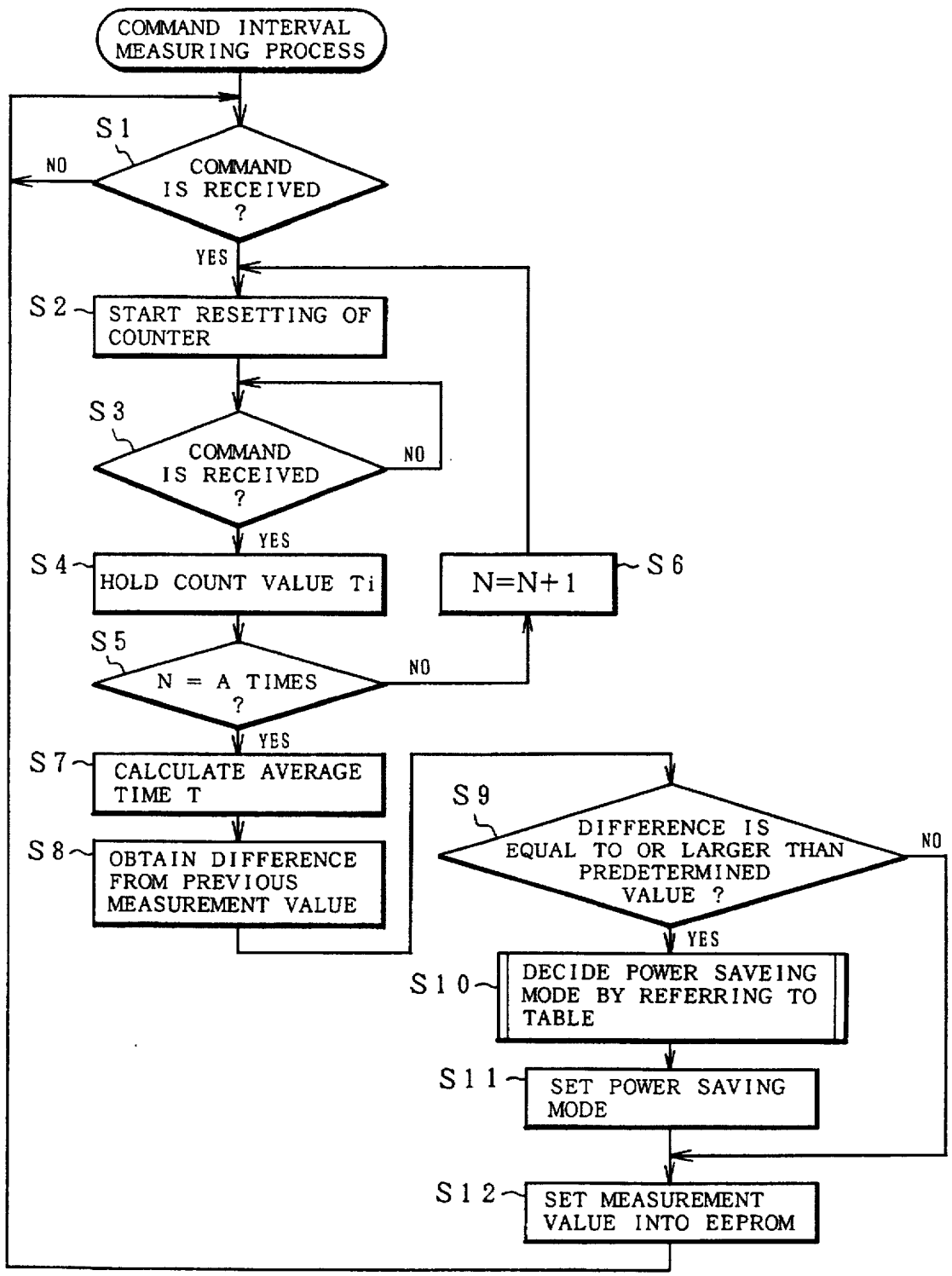
FIG. 12 is a flowchart for a command interval measuring process in FIG. 10.

A flowchart of FIG. 12 shows the measuring process by the measuring unit 62 in FIG. 10. The processing steps in the flowchart are similar to those in the first invention of FIG. 7 except the decision of the power saving mode in step S10 and the setting of the power saving mode in step S11. The deciding process of the power saving mode in step S10 is executed in the case where the difference between the measurement times is equal to or larger than the predetermined value in step S9. With reference to the mode table 166, for example, the power save control information of the mode number corresponding to the current command time interval (T) is selected from the table contents of FIG. 11. The selected power save control information is set into the power save control unit 68 in step S11. In step S12, the current measurement value (T) is set into the EEPROM 42 and is updated.

Figure 13:
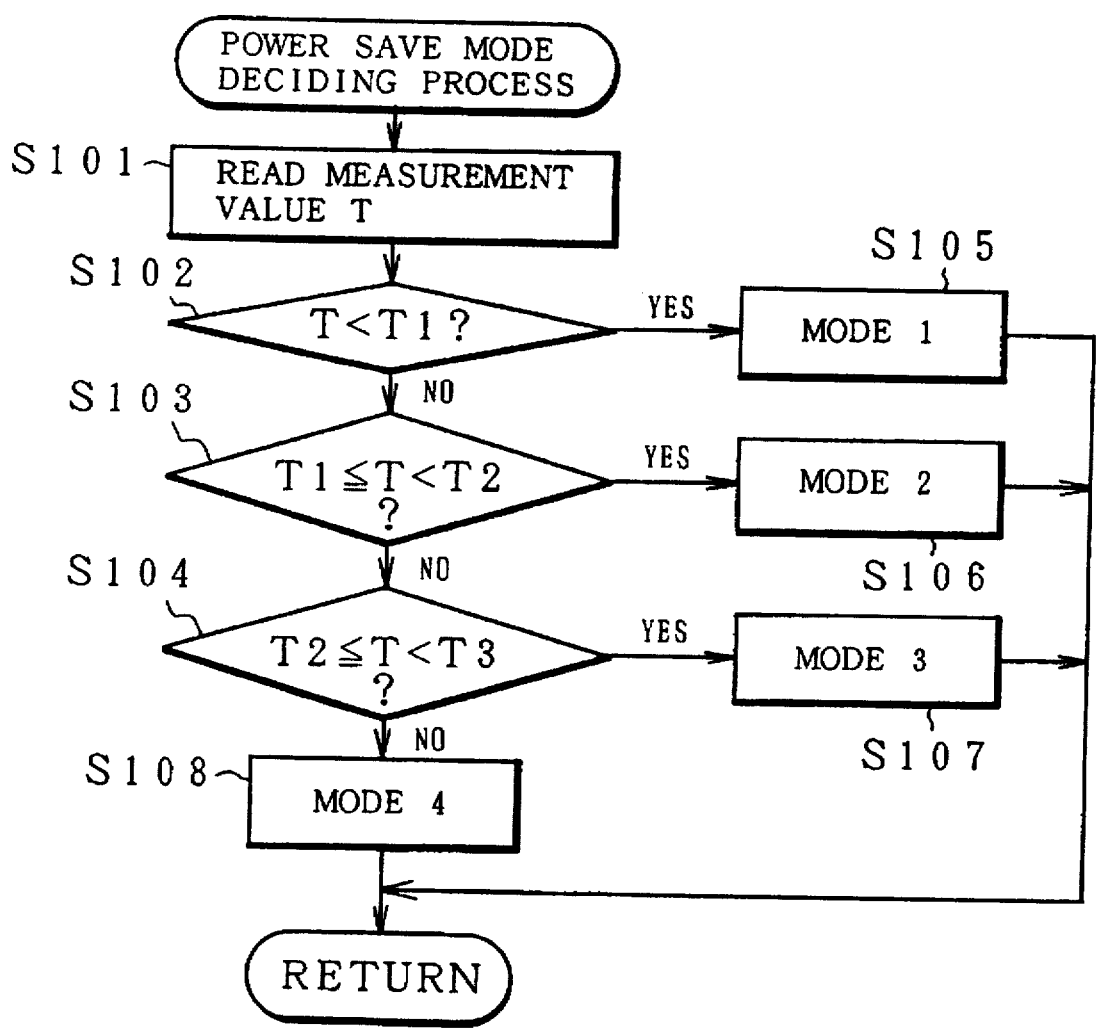
FIG. 13 is a flowchart showing a power saving mode deciding process in FIG. 12 by a subroutine.

FIG. 13 shows a power saving mode deciding process in step S10 in FIG. 12 as a subroutine. The subroutine relates to the table contents of FIG. 11 as a target. First in step S101, the measurement value (T) is read. In step S102, a check is made to see if the measurement value (T) is less than (T1=5 sec). When (T) is less than (T1=5 sec), the power save control information in the mode 1 is selected in step S105. In step S102, when (T) is not less than (T1=5 sec), a check is made in step S103 to see if (T) is equal to or larger than (T1=5 sec) and is less than (T2=30 sec). When (T) lies within the above range, the power save control information in the mode 2 is selected in step S106. When (T) is out of the range in step S103, step S104 follows and a check is made to see if (T) is equal to or larger than (T2=30 sec) and is less than (T3=60 sec). When (T) lies within this range, the power save control information in the mode 3 in step S107 is selected. When (T) is out of the range in step S104, (T) is equal to or larger than (T3=60 sec), so that step S108 follows and the power save control information in the mode 4 is selected. In the selection of the power save control information based on the measured command time interval (T), it can be selected with reference to the mode table 166 prepared in the RAM or the like as shown in the functional block diagram of FIG. 10 or can be also selected by the execution of the value described on the program as shown in the subroutine of FIG. 13.

Figure 14:
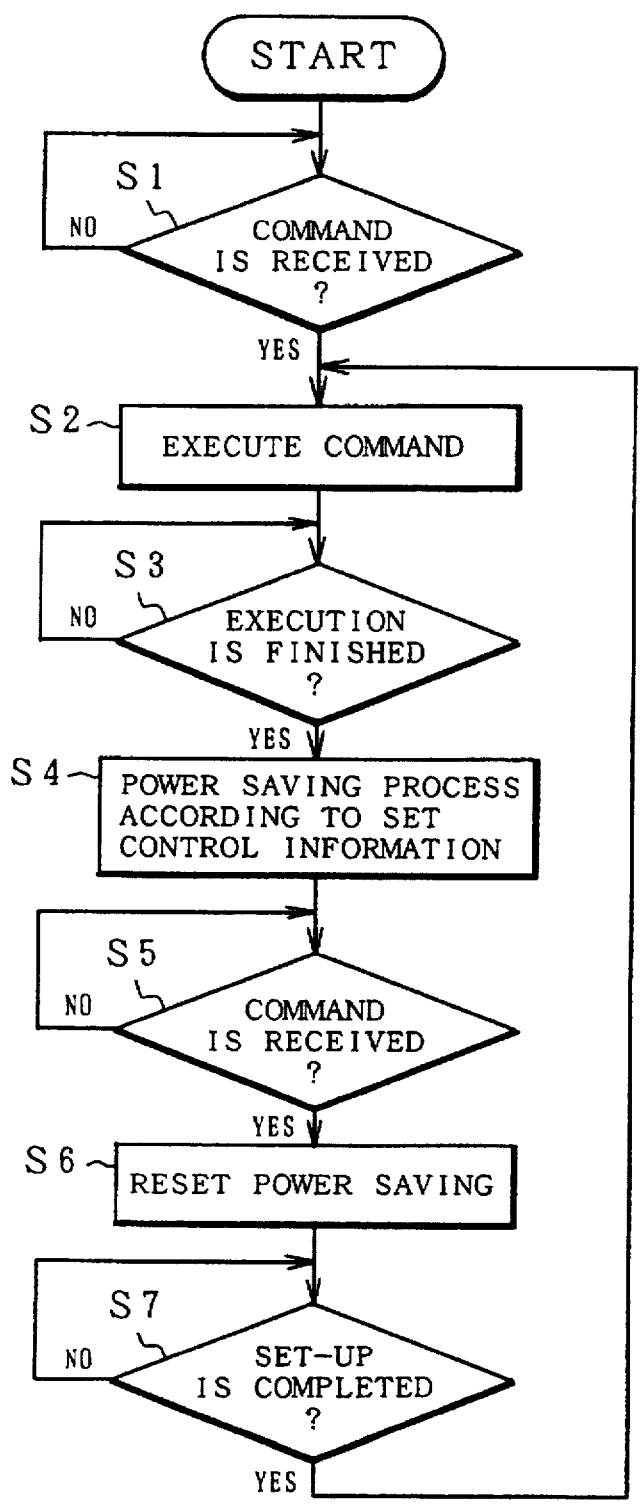
FIG. 14 is a flowchart for a power save control in FIG. 10.

A flowchart of FIG. 14 relates to the processes of the power save control unit 68 in FIG. 10. First in step S1, a check is made to see if the command from the upper apparatus has been received. When the command is received, step S2 follows and the command is interpreted and executed. In step S3, a check is made to see if the execution of the command has been finished. When the end of the execution is discriminated, step S4 follows and with reference to the mode table 166 based on the measurement time (T) at that time, the power saving process according to the power save control information which has already been set is executed. That is, data bit 1 is set into the registers of the circuit units designated by the power save control information, thereby shutting off the power supply. Among the designated circuit units, with respect to the clock generating circuit 38, the clock frequency is reduced by switching the frequency dividing clock and the operating speed of the MPU 36 is decreased, thereby reducing the current consumption. In step S5, a check is made to see if the command from the upper apparatus has been received during the power saving. When the command is received, step S6 follows and the power saving mode is reset, namely, data bit 0 is set into the register of each circuit unit, thereby restarting the power supply and recovering the clock frequency. In step S7, a check is made to see if the set-up in association with the power save reset has been completed. When the completion of the set-up is confirmed, step S2 follows, the command received in the power saving state is analyzed and the corresponding process is executed.

In such a power save control according to the modification of the invention, when the measurement time (T) of the command interval is short, the electric power consumption is reduced by the power saving due to the shut-off of the power sources of the circuit units of short return times or the reduction of the operating speed. Even in case of the short command interval, since the return time for the command reception during the power saving is also short, the deterioration of the performance due to the return time from the power saving can be minimized to the necessary least degree. When the measurement time (T) of the command interval is so long to be a time exceeding one minute, all of the circuit units as targets of the power saving are immediately set to the power saving mode by the end of the execution of the command. Only the least necessary circuit units which can recognize the command reception from the upper apparatus are held in the operative mode, so that the power saving which can make the most of the saving effect of the electric power consumption can be performed. In this case, the return time until the power saving mode is reset after the command was received is so long to be, for example, about three minutes because, for instance, it is necessary to rotate the disk at a constant velocity by the activation of the spindle motor. However, since the apparatus is inherently in the use environment such that the disk is hardly accessed, the return time of such an extent does not cause a problem on the operation. Even in the case where the command interval fluctuates due to a change in use environment, the command interval is measured and the optimum power save control is performed, so that the dynamic power save control according to the change in use environment can be performed.

In a work such as a formation of a document in the host computer or the like, the command interval is remarkably long depending on the time which is required until the process is returned to the disk by the end of the document formation after the disk was first accessed to develop the document. In such a case, even if the command interval is measured, since such a time interval is too long, it cannot be actually measured. Therefore, an overflow timer to monitor the time for the measuring process is provided for the measuring unit 62 in FIG. 10. A time of the overflow timer is set to, for example, 5 minutes. If measurement results of a plurality of number of times are not derived even after the elapse of five minutes, the set value (T=5 min) of the overflow timer is outputted as a measurement time. The power saving mode control information by the maximum command interval is selected.

According to the invention as mentioned above, when the measurement time of the command interval is short, the power save timing of the short interval is decided. When the measurement time is long, the power save timing of the long interval is determined. In any case, the power saving is performed in accordance with the order of the circuit units of short return times. Therefore, even when the command intervals are different due to the operation environment, the power saving in which the power save timings are distributed onto the time base at the same ratio in the command interval is performed. A situation such that the timing of the power saving of the circuit unit becomes too late or early due to a change in command interval can be avoided. The power saving which makes the most of the saving effect of the electric power consumption can be performed.

According to the modification of the invention, the power saving of one or a plurality of circuit units is decided in accordance with the measurement time of the command interval. The circuit units decided are immediately subjected to the power saving at the time of the end of the execution of the command, so that the electric power consumption can be maximally reduced in accordance with the use environment of the disk apparatus. The return time for the command generation in the power saving state is optimized in accordance with the measurement time of the command interval, so that the deterioration of the performance of the apparatus when returning from the power saving mode can be minimized.

Although the above embodiment has been described with respect to the magnetic disk apparatus as an example, the invention is not limited to such an example but can be also applied as it is to proper memory apparatuses such as optical disk apparatus, floppy disk apparatus, magnetic tape apparatus, and the like. The invention is not limited by the numerical values shown in the above embodiment. The number of circuit units as targets of the power saving can be properly decided as necessary.

What is claimed is:

1. A memory apparatus comprising:
   measuring means for measuring a time of a command interval from a timing when an execution of a command generated from an upper apparatus is finished to a timing when a next command is received;
   timing deciding means for varying a timing to perform a power saving on the basis of the measurement time of the command interval measured by said measuring means; and
   power save control means for controlling the apparatus to a power saving mode for a time interval from the timing decided by said timing deciding means after the end of the execution of the command received from said upper apparatus until a timing when a next command is obtained.

2. An apparatus according to claim 1, wherein said measuring means measures times of a plurality of command intervals generated from the upper apparatus and obtains a mean value, and said timing deciding means decides the timing to perform the power saving on the basis of said mean value.

3. An apparatus according to claim 1, wherein for an increase in time of the command interval, said timing deciding means decides the timings for performing the power saving in accordance with the order of circuit units in which return times at the time of a power-on start are short.

4. An apparatus according to claim 3, wherein for an increase in time of the command interval, said timing deciding means decides the timings for performing the power saving in accordance with the order of at least a read/write circuit unit, a circuit unit to drive a head, and a circuit unit to rotate a medium.

5. An apparatus according to claim 3, wherein for an increase in time of the command interval, said timing deciding means decides the timings for performing the power saving in accordance with the order of at least a read/write circuit unit, a clock generating circuit of a processor, a circuit unit to drive a head, and a circuit unit to rotate a medium.

6. An apparatus according to claim 3, wherein for an increase in time of the command interval, said timing deciding means decides the timings for performing the power saving in accordance with the order of at least a read/write circuit unit, a clock generating circuit of a processor, a circuit unit to drive a head, a circuit unit to rotate a medium, and a circuit unit to drive a cooling fan.

7. An apparatus according to claim 3, wherein in the case where the measurement time of the command interval exceeds a predetermined maximum time, said timing deciding means decides the timing by allowing only circuit units which can recognize the command reception from the upper apparatus to be left and setting other circuit units to targets of the power saving.

8. An apparatus according to claim 1, wherein the measurement time of the command interval is stored into a non-volatile memory or a memory medium and said timing deciding means decides the timing for performing the power saving by using the measurement time of the command interval stored in said non-volatile memory or said disk medium by a power-on start after a power source was turned off.

9. An apparatus according to claim 8, wherein the measurement time of the command interval stored in said non-volatile memory or said memory medium is updated each time the measurement is executed by said measuring means.

10. A memory apparatus comprising:
    measuring means for measuring a time of a command interval from a timing when an execution of a command generated from an upper apparatus is finished to a timing when a next command is received;
    deciding means for deciding one or a plurality of circuit units to be subjected to a power saving in accordance with the measurement time of the command interval by said measuring means; and
    power save control means for controlling the apparatus to a power saving mode for a time interval from the timing decided by said timing deciding means after the end of the execution of the command received from said upper apparatus until a timing when a next command is obtained.

11. An apparatus according to claim 10, wherein said measuring means measures time intervals of a plurality of commands generated from the upper apparatus and obtains a mean value.

12. An apparatus according to claim 10, wherein for an increase in the measurement time of the command interval, said deciding means increases the number of circuit units for performing the power saving in accordance with the order of the circuit units in which return times at the time of a power-on start are short.

13. An apparatus according to claim 12, wherein for an increase in the measurement time of the command interval, said deciding means increases the number of circuit units for performing the power saving in accordance with the order of at least a read/write circuit unit, a circuit unit to drive a head, and a circuit unit to rotate a medium.

14. An apparatus according to claim 12, wherein for an increase in the measurement time of the command interval, said deciding means increases the number of circuit units for performing the power saving in accordance with the order of at least a read/write circuit unit, a clock generating circuit of a processor, a circuit unit to drive a head, and a circuit unit to rotate a medium.

15. An apparatus according to claim 12, wherein for an increase in the measurement time of the command interval, said deciding means increases the number of circuit units for performing the power saving in accordance with the order of at least a read/write circuit unit, a clock generating circuit of a processor, a circuit unit to drive a head, a circuit unit to rotate a medium, and a circuit unit to drive a cooling fan.

16. An apparatus according to claim 12, wherein in the case where the measurement time of the command interval exceeds a predetermined maximum time, said deciding means allows only the circuit units which can recognize the command reception from the upper apparatus to be left and sets all of the other circuit units to targets of the power saving.

17. An apparatus according to claim 10, wherein said measuring means stores the measurement time of the command interval into a non-volatile memory or a memory medium, and said deciding means decides one or a plurality of circuit units to be subjected to the power saving by using the measurement time stored in said non-volatile memory or said memory medium by a power-on start after a power source was turned off.

18. An apparatus according to claim 17, wherein the measurement time of the command interval stored in said non-volatile memory or said memory medium is updated each time the measurement is executed by said measuring means.

* * * * *